(12) United States Patent  (10) Patent No.: US 9,233,839 B2
Liu et al.                  (45) Date of Patent:    Jan. 12, 2016

(54) MEMS DEVICE AND METHOD OF FORMING THE SAME

(71) Applicant: Taiwan Semiconductor Manufacturing Company Limited, Hsinchu (TW)

(72) Inventors: Yu-Chia Liu, Kaohsiung (TW); Chia-Hua Chu, Hsinchu County (TW); Jung-Huei Peng, Hsinchu Hsien (TW); Kuei-Sung Chang, Kaohsiung (TW); Chun-Wen Cheng, Hsinchu County (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 13/956,457

(22) Filed: Aug. 1, 2013

(65) Prior Publication Data

US 2015/0035089 A1    Feb. 5, 2015

(51) Int. Cl.
*B81B 3/00* (2006.01)
*B81B 7/02* (2006.01)

(52) U.S. Cl.
CPC ........... *B81B 7/02* (2013.01); *B81C 2203/0714* (2013.01)

(58) Field of Classification Search
CPC .... B81B 3/0018; B81B 7/02; B81C 1/00158; B81C 2203/0714
USPC ...................................... 438/50–53
See application file for complete search history.

(56) References Cited

U.S. PATENT DOCUMENTS 7,357,035 B2 *  4/2008  Liu et al. ...................... 73/756

* cited by examiner

*Primary Examiner* — Tran Tran
*Assistant Examiner* — Trang Q Tran
(74) *Attorney, Agent, or Firm* — Jones Day

(57) ABSTRACT

A method for forming a MEMS device is provided. The method includes the following steps of providing a substrate having a first portion and a second portion; fabricating a membrane type sensor on the first portion of the substrate; and fabricating a bulk silicon sensor on the second portion of the substrate.

17 Claims, 20 Drawing Sheets

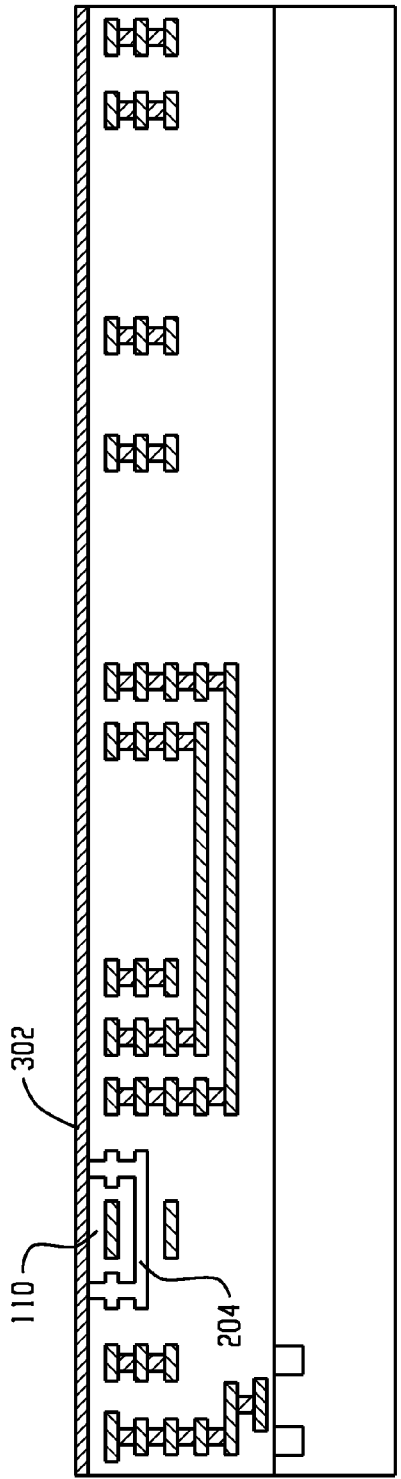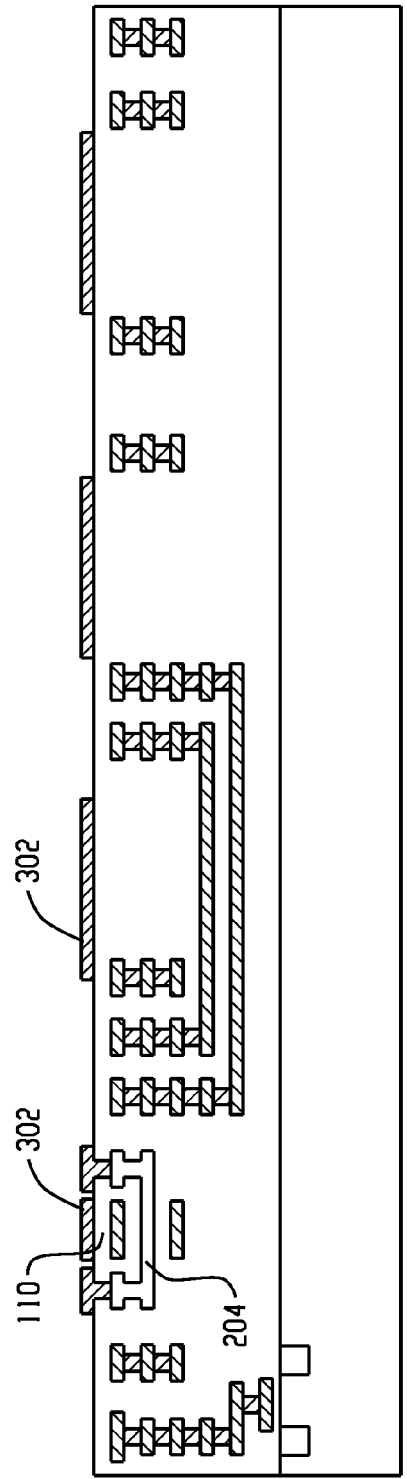

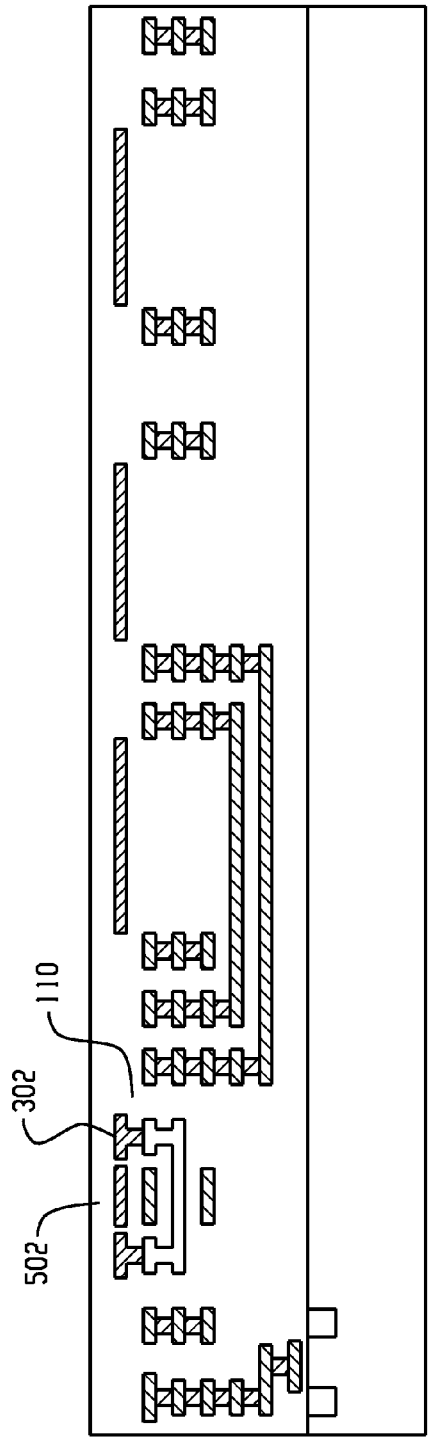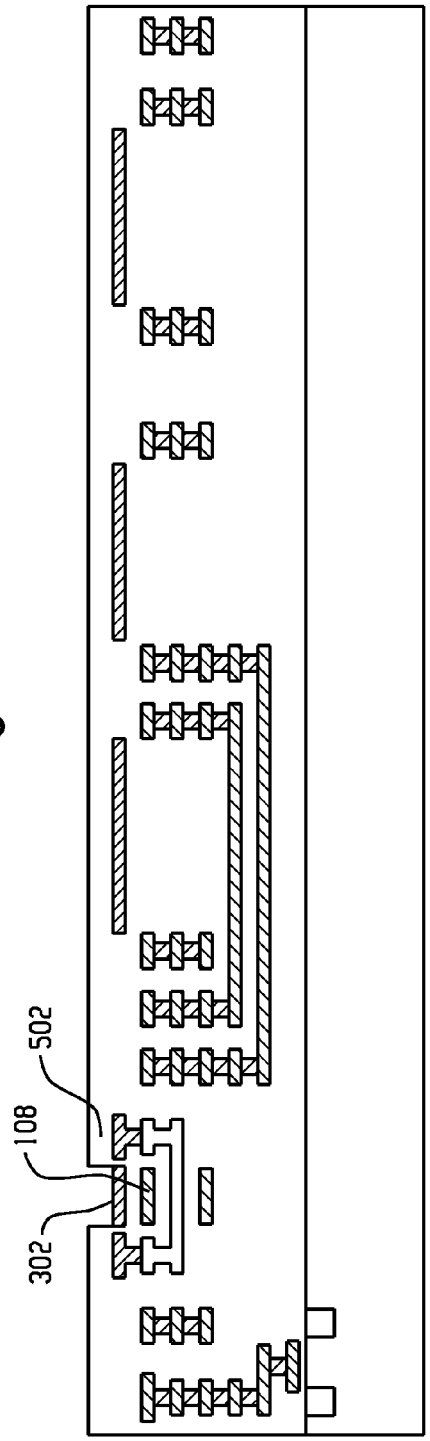

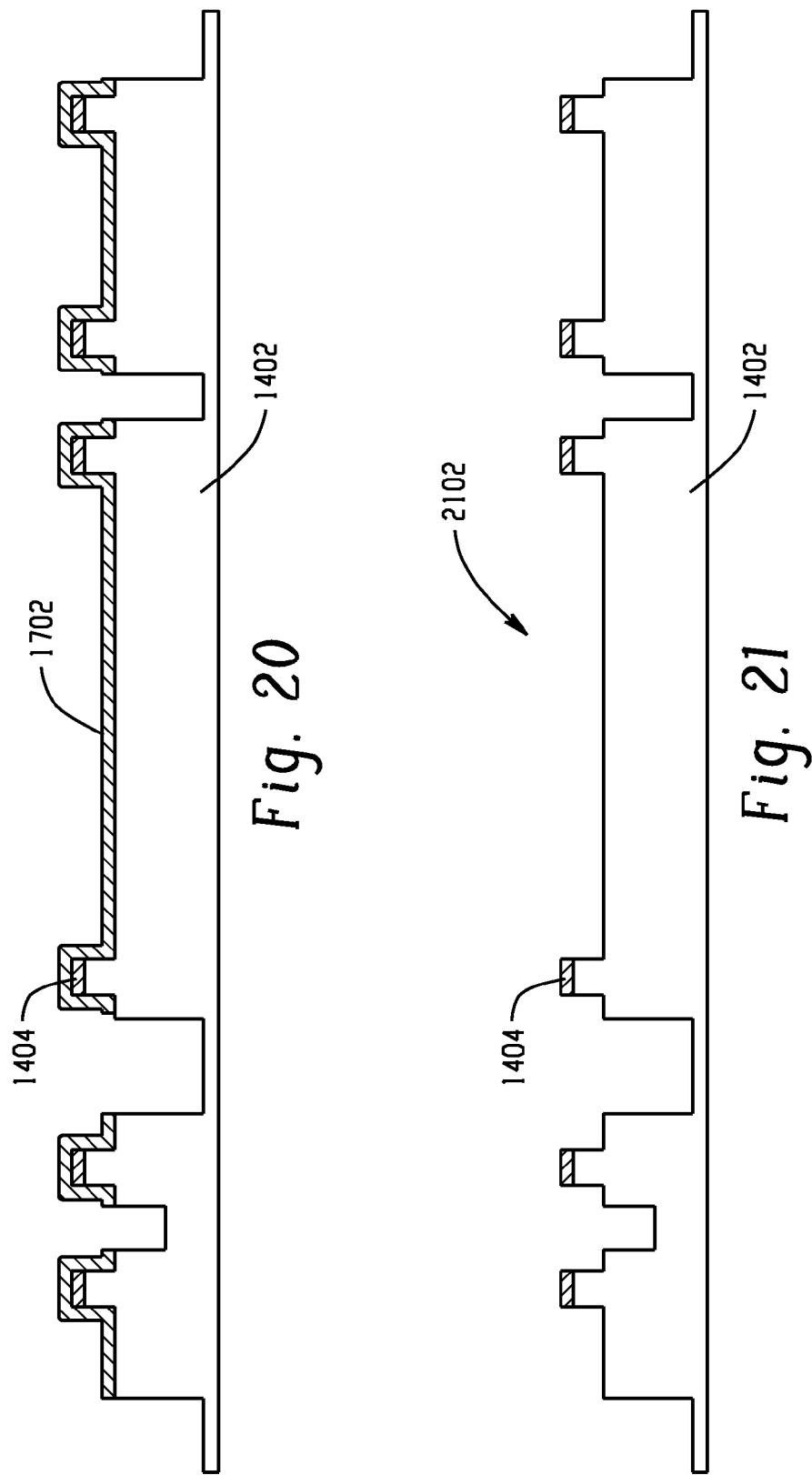

MEMS DEVICE AND METHOD OF FORMING THE SAME

FIELD

This disclosure relates generally to semiconductor processes, and, more particularly, to microelectromechanical systems (MEMS) devices and a method of forming a MEMS device.

BACKGROUND

MEMS devices are widely used and may include membrane type sensors and bulk silicon sensors. Bulk silicon sensors with a large proof-mass may provide motion sensors with high mechanical sensitivity. However, fabrication of membrane type sensors using a bulk silicon structure is difficult because the high stiffness of the bulk silicon structure does not provide sensitivity needed by membrane type sensors. Furthermore, combinations of CMOS wafers and MEMS wafers may cause an out-gassing issue that diffuses hydrogen (H2) from the PECVD oxide. The subsequent pressure level shift within the MEMS device induced by the hydrogen may degrade the performance of the devices.

SUMMARY

According to an embodiment of the invention, a method for forming a MEMS device is provided. The method includes the following operations of providing a substrate having a first portion and a second portion; fabricating a membrane type sensor on the first portion of the substrate; and fabricating a bulk silicon sensor on the second portion of the substrate.

According to an embodiment of the invention, a MEMS device is provided. The MEMS device includes a substrate, a membrane type sensor and a bulk silicon sensor. The substrate has a first portion and a second portion. The membrane type sensor is disposed on the first portion of the substrate. The bulk silicon sensor is disposed on the second portion of the substrate.

BRIEF DESCRIPTION OF THE DRAWINGS

FIG. 3 is a sectional view illustrating providing of a sealing layer for forming the MEMS device according to the embodiment of the invention.

FIG. 4 is a sectional view illustrating removing of a portion of the sealing layer for forming the MEMS device according to the embodiment of the invention.

FIG. 5 is a sectional view illustrating providing of an oxide layer for forming the MEMS device according to the embodiment of the invention.

FIG. 6 is a sectional view illustrating removing of a portion of the oxide layer for forming the MEMS device according to the embodiment of the invention.

FIG. 20 is a sectional view illustrating removing of a portion of the capping silicon layer for forming the MEMS device according to the embodiment of the invention.

FIG. 21 is a sectional view illustrating removing of a portion of the capping oxide layer for forming the MEMS device according to the embodiment of the invention.

DETAILED DESCRIPTION

Reference will now be made in detail to exemplary embodiments, which are illustrated in the accompanying drawings. Wherever possible, the same reference numbers will be used throughout the drawings to refer to the same or like parts.

In an exemplary embodiment of the invention, a gap of a membrane type sensor may be achieved by, for example, high etching selectivity between metal layers and oxide layers. A CMOS wafer may be utilized for fabricating the membrane type sensor due to the thin film layer. In addition, the bulk silicon of a MEMS wafer can be utilized for fabricating bulk silicon sensors. Therefore, membrane type sensors and bulk silicon sensors may be formed on the same wafer through compatible processes.

In an exemplary embodiment of the invention, different thicknesses of the membrane of the membrane type sensor may be implemented by, for example, a simple metal wet etching technique. A metal layer may used as the sacrificial layer, so that the sensing gap of membrane type sensor can be formed. The multi-sensing range of sensors may be achieved by, for example, high etching selectivity of metal wet etching technique.

In an exemplary embodiment of the invention, Titanium material may not only be used as the sealing material for the membrane type sensor, but also may be used as the getter. The metal sealing layer may provide a better vacuum level than the oxide sealing layer and may also reduce the charging issue which may induced by the operation of membrane type sensor. In addition, the Titanium may absorb hydrogen gas that outgases from the oxide layer of the CMOS wafer and maintain the cavity vacuum level at a relatively stable level for membrane type sensors and bulk silicon sensors.

In an exemplary embodiment, a MEMS device includes a membrane type sensor and a bulk silicon sensor. The membrane type sensor may be, for example, a pressure sensor, an acoustic sensor, a radio-frequency resonator, or a radio-frequency oscillator. The bulk silicon sensor may be, for example, an accelerometer, a gyroscope, a magnetic sensor, a radio-frequency resonator, and a radio-frequency oscillator.

Figure 1:
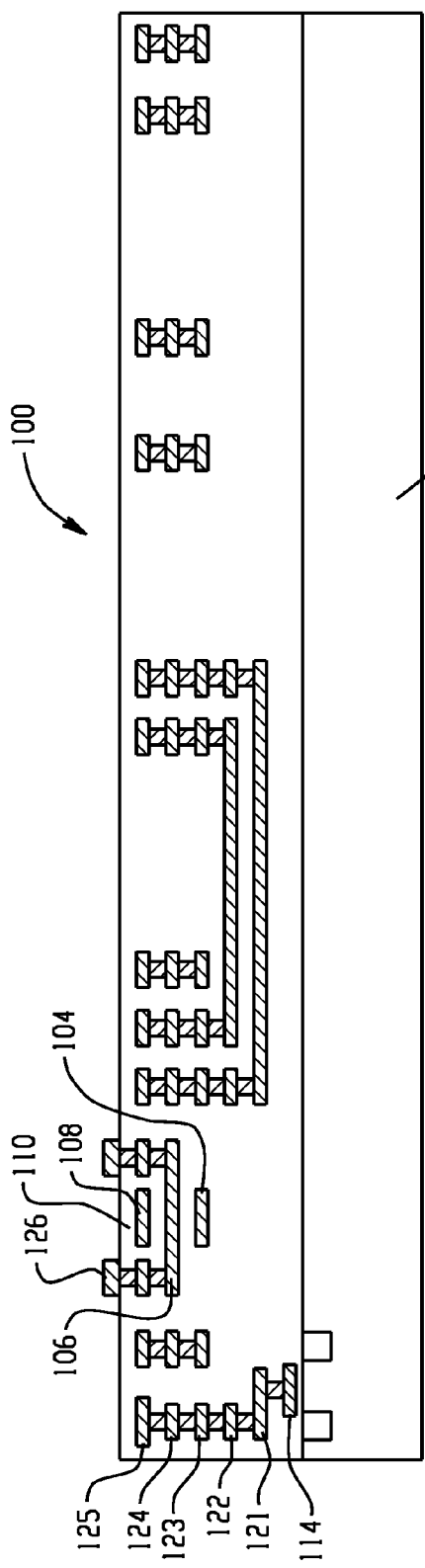
FIG. 1 is a sectional view illustrating an exemplary structure with multiple metal layers and a poly layer for forming a MEMS device according to an embodiment of the invention.

FIG. 1 is a sectional view illustrating an exemplary structure with multiple metal layers and a poly layer for forming a MEMS device according to an embodiment of the invention. As shown in FIG. 1, a substrate 102 may be provided in the MEMS device 100. A conductive base 104 may be provided over the substrate 102. A sacrificial layer 106 may be provided over the conductive base 104. A reference element 108 may be provided over the sacrificial layer 106. A dielectric layer 110 may be provided over the reference element 108. The substrate 102 may be formed of silicon. The conductive base 104 and the reference element 108 may be any conductive layer able to form a capacitance, including, but not limited to, aluminum-copper and copper, for example.

In the exemplary embodiment, a semiconductor process having six metal layers 121-126 and one poly 114 may be utilized and a portion of the metal layers 121-126 may be used as the conductive base 104 and reference element 108. Those skilled in the art upon reading this detailed description will appreciate that other numbers of metal and poly layers may be used. The thickness of the metal layers 121-126 may be, for example, about 8000 Å, 20000 Å or 40000 Å. In the illustrated exemplary embodiment, a process without passivation layer may be used. However, a process with a passivation layer may be used by, for example, performing a wet etching to remove the passivation layer.

Figure 2:
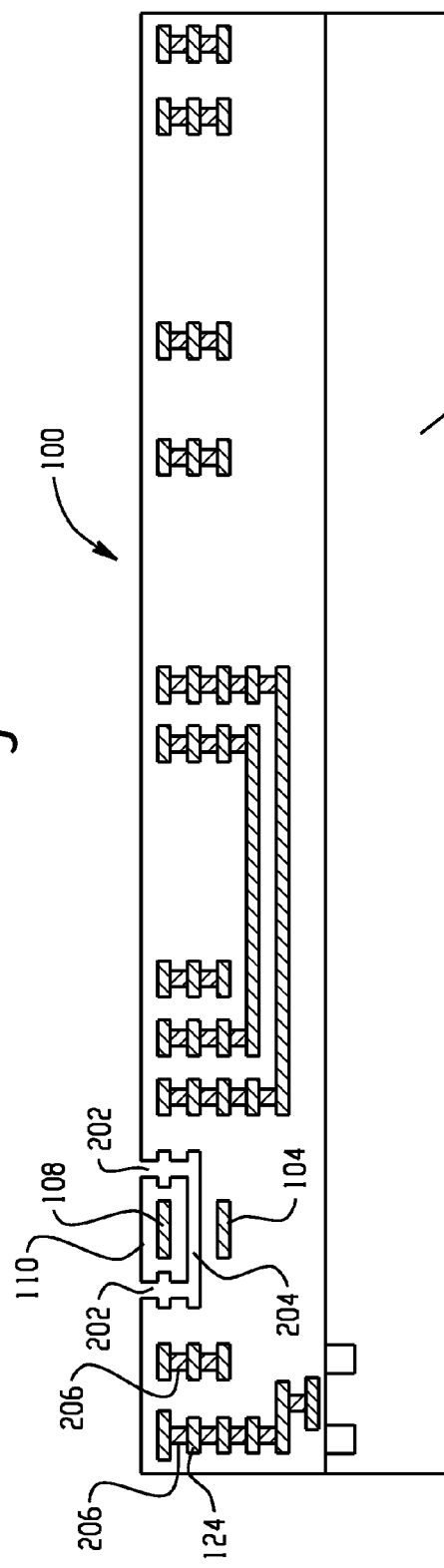
FIG. 2 is a sectional view illustrating removing of a sacrificial layer for forming the MEMS device according to the embodiment of the invention.

FIG. 2 is a sectional view illustrating removing of a sacrificial layer for forming the MEMS device according to the embodiment of the invention. As shown in FIGS. 1-2, a portion of CMOS wafer vias 206 may be removed and holes 202 formed. Then, a portion of the sacrificial layer 106 may be removed between the reference element 108 and the conductive base 104 using the holes 202. The holes 202 may extend through the dielectric layer 110 and the reference element 108 to the sacrificial layer 106 to form a first cavity 204 of the membrane type sensor between the reference element 108 and the conductive base 104. In the exemplary embodiment, removing a portion of the sacrificial layer 106 may be performed by isotropic etching. In the exemplary embodiment, the CMOS wafer vias 206 may be formed of Tungsten.

In the exemplary embodiment, a portion of the Tungsten via and a portion of the sacrificial layer 106 may be removed by wet etching. In the exemplary embodiment, the fourth of the metal layers 124 may be used as the sacrificial layer 106. The extent of removal of the portion of the sacrificial layer 106 may be varied to provide a pressure sensor, which is one type of membrane type sensor, of varying sensitivities and characteristics. For example, the pressure sensor may be formed with varying thickness, gap and sensitivity.

FIG. 3 is a sectional view illustrating providing of a sealing layer for forming the MEMS device according to the embodiment of the invention. As shown in FIG. 3, a sealing layer 302 may be formed above the dielectric layer 110 and may seal the first cavity 204 of the membrane type sensor. In the exemplary embodiment, the sealing layer 302 may be formed of Titanium which may also be used as a getter for the membrane type sensor and the bulk silicon sensor. Titanium may absorb hydrogen that comes from the dielectric layer 110 formed of oxide. Therefore, since the vacuum pressure level shift in the first cavity 204 due to out-gassing of hydrogen is reduced, the performance of the MEMS device may be improved. In the exemplary embodiment, the sealing layer 302 may have a thickness of about 3000 Å to 10000 Å.

FIG. 4 is a sectional view illustrating removing of a portion of the sealing layer for forming the MEMS device according to the embodiment of the invention. As shown in FIG. 4, a mask (not shown) may be used to define an etching region for the sealing layer 302. Then, a portion of the sealing layer 302 may be removed by, for example, a dry etching process.

FIG. 5 is a sectional view illustrating providing of an oxide layer for forming the MEMS device according to the embodiment of the invention. As shown in FIG. 5, an oxide layer 502 may be formed over the sealing layer 302 and the dielectric layer 110 to provide a motion space for the bulk silicon sensor. In the exemplary embodiment, the dielectric layer 110 may be formed of oxide and be the same material as the oxide layer 502. In the exemplary embodiment, the oxide layer 502 may have a thickness of about 3 μm to 8 μm. In the exemplary embodiment, chemical mechanical polishing may be performed on the oxide layer 502 to prepare for a fusion bonding.

FIG. 6 is a sectional view illustrating removing of a portion of the oxide layer for forming the MEMS device according to the embodiment of the invention. As shown in FIG. 6, a mask (not shown) may be used to define an etching region for the oxide layer 502. Then, a portion of the oxide layer 502 over the reference element 108 may be removed by, for example, a dry etching process to expose a portion of the sealing layer 302. Sealing layer 302 may be removed to improve stress balance for the membrane type sensor.

Figure 7:
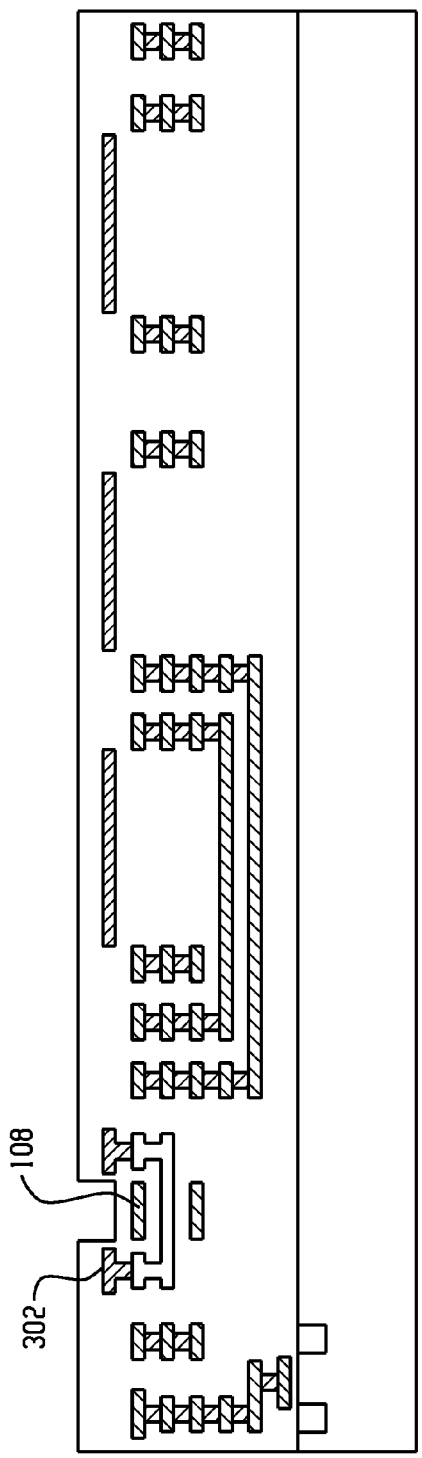
FIG. 7 is a sectional view illustrating removing of a portion of the sealing layer for forming the MEMS device according to the embodiment of the invention.

FIG. 7 is a sectional view illustrating removing of a portion of the sealing layer for forming the MEMS device according to the embodiment of the invention. As shown in FIG. 7, a mask (not shown) may be used to define etching region for the sealing layer 302. Then, a portion of the sealing layer 302 over the reference element 108 may be removed by, for example, a wet etching process to improve stress balance for the membrane type sensor.

Figure 8:
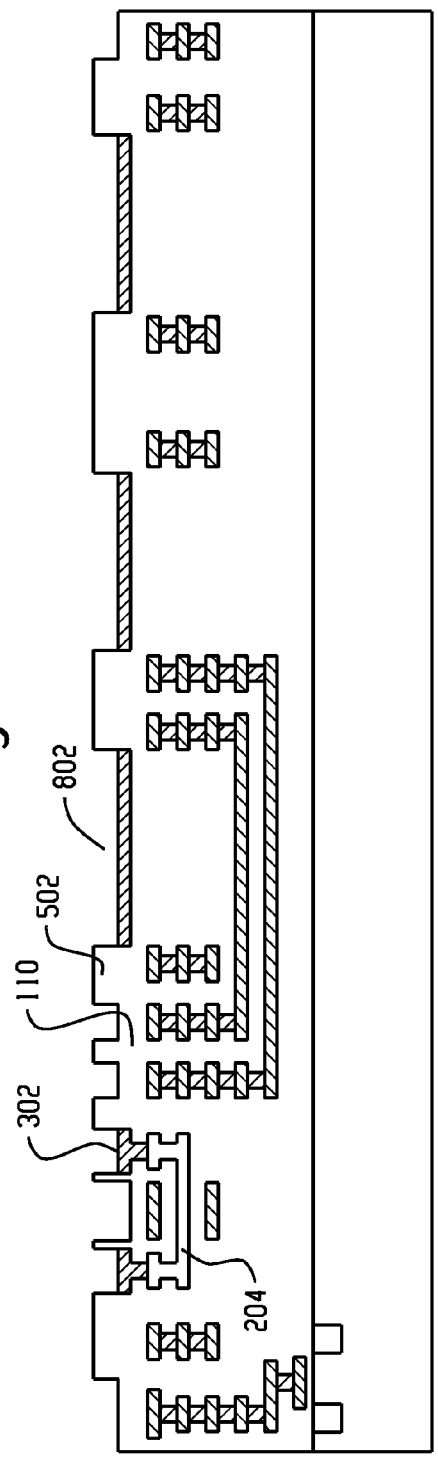
FIG. 8 is a sectional view illustrating removing of a portion of the oxide layer for forming the MEMS device according to the embodiment of the invention.

FIG. 8 is a sectional view illustrating removing of a portion of the oxide layer for forming the MEMS device according to the embodiment of the invention. As shown in FIG. 8, a mask (not shown) may be used to define an etching region for the oxide layer 502. Then, a portion of the oxide layer 502 may be removed by, for example, a dry etching process to expose the sealing layer 302. In the exemplary embodiment, the sealing layer 302 may be formed of Titanium which may serve also as a getter for the membrane type sensor and the bulk silicon sensor. Titanium may absorb hydrogen that comes from the dielectric layer 110 formed of oxide or from the oxide layer 502. Therefore, since the vacuum pressure level shift in the first cavity 204 due to out-gassing hydrogen is reduced, the performance of the MEMS device may be improved.

In the exemplary embodiment, another portion of the oxide layer 502 may be removed by, for example, a dry etching process for further electrical pad connection. In the exemplary embodiment, the oxide layer may be patterned to provide a first cavity of the bulk silicon sensor 802.

Figure 9:
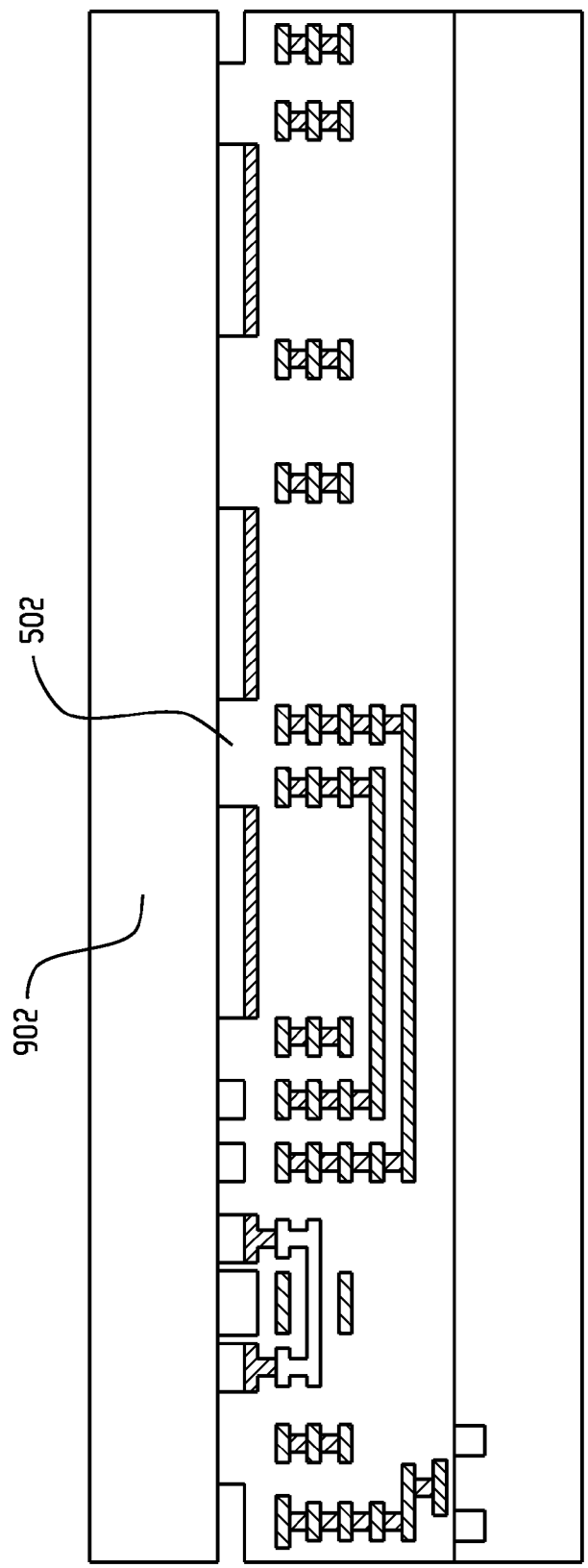
FIG. 9 is a sectional view illustrating bonding of a silicon layer to the oxide layer for forming the MEMS device according to the embodiment of the invention.

FIG. 9 is a sectional view illustrating bonding of a silicon layer to the oxide layer for forming the MEMS device according to the embodiment of the invention. As shown in FIG. 9, a silicon layer 902 may be bonded to the oxide layer 502 by, for example, oxide-silicon fusion bonding. In the exemplary embodiment, the silicon layer 902 may have a thickness of about 600 µm to 700 µm at the beginning. Then, the silicon layer 902 may be thinned down to about 20 µm to 50 µm.

Figure 10:
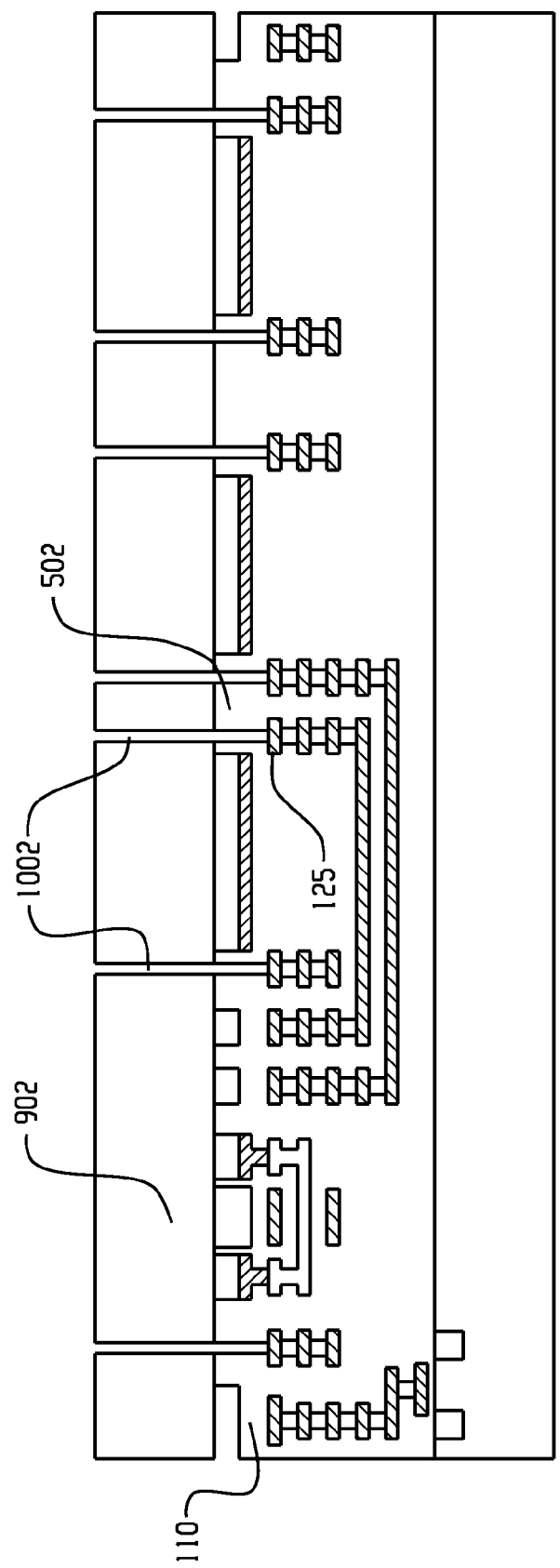
FIG. 10 is a sectional view illustrating removing of a portion of the silicon layer for forming the MEMS device according to the embodiment of the invention.

FIG. 10 is a sectional view illustrating removing of a portion of the silicon layer for forming the MEMS device according to the embodiment of the invention. As shown in FIG. 10, a mask (not shown) may be used to define an etching region for the silicon layer 902, the oxide layer 502, and the dielectric layer 110. Then, a portion of the silicon layer 902, the oxide layer 502, and the dielectric layer 110 may be removed by, for example, a dry etching process to expose the metal layer 125 and form holes 1002. The holes 1002 may extend from silicon layer 902 through the oxide layer 502 and the dielectric layer 110 to the metal layer 125.

Figure 11:
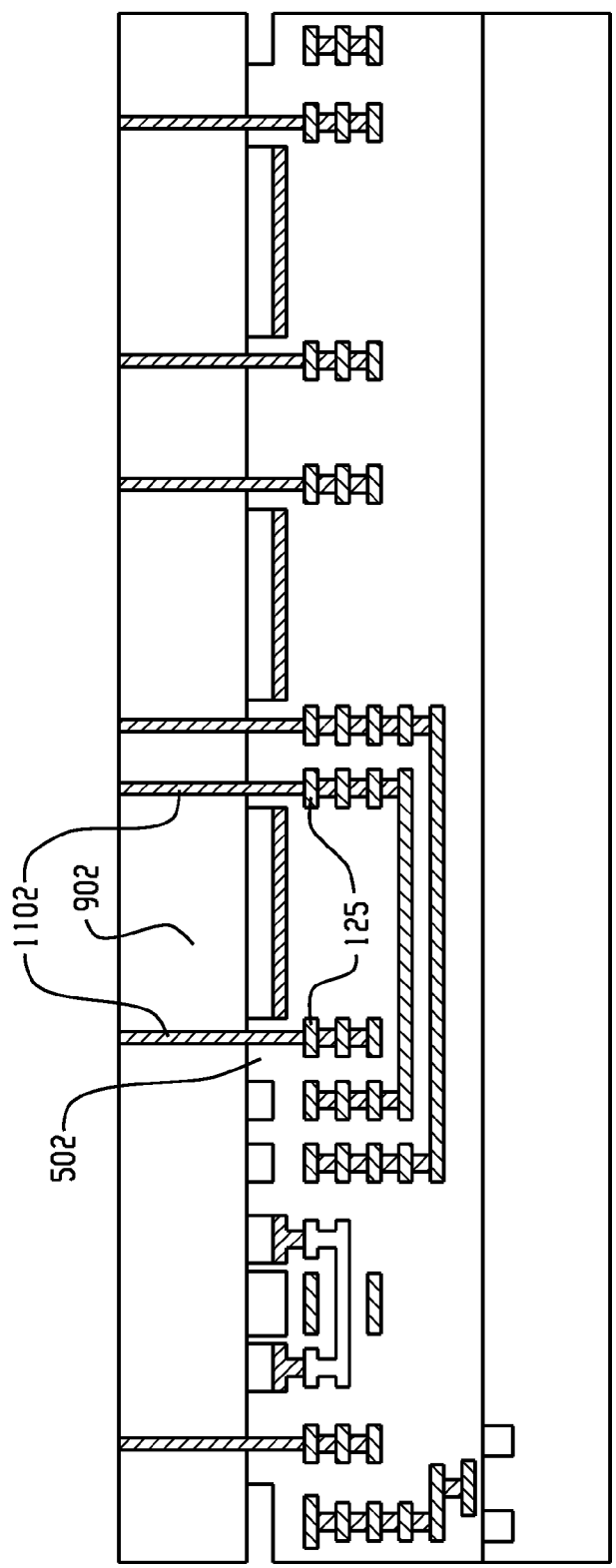
FIG. 11 is a sectional view illustrating providing of vias for forming the MEMS device according to the embodiment of the invention.

FIG. 11 is a sectional view illustrating providing of vias for forming the MEMS device according to the embodiment of the invention. As shown in FIG. 11, vias 1102 may be formed to extend from silicon layer 902 through the oxide layer 502 and the dielectric layer 110 to the metal layer 125 in order to have the bulk silicon sensor and the membrane type sensor electrically connectable. The vias 1102 may be formed of, for example, Tungsten.

Figure 12:
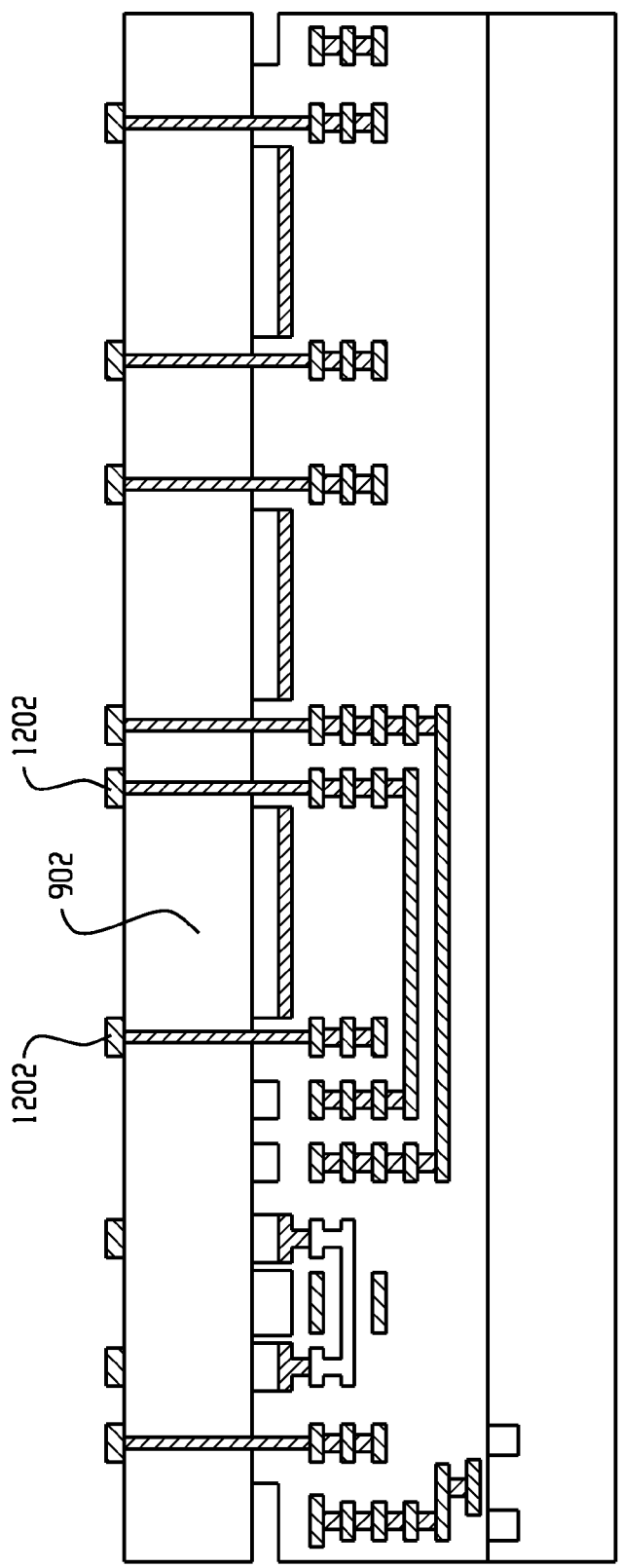
FIG. 12 is a sectional view illustrating providing of a bonding pads for forming the MEMS device according to the embodiment of the invention.

FIG. 12 is a sectional view illustrating providing of a bonding pads for forming the MEMS device according to the embodiment of the invention. As shown in FIG. 12, a mask (not shown) may be used to define a deposition region for bonding pads 1202. Then, the bonding pads 1202 are formed over the silicon layer 902 by, for example, a deposition process and are prepared for Eutectic bonding. The bonding pads 1202 may be any conductive layer able to form a capacitance, including, but not limited to, aluminum-copper, for example. The bonding pads 1202 may have a thickness of about 6000 Å to 10000 Å.

Figure 13:
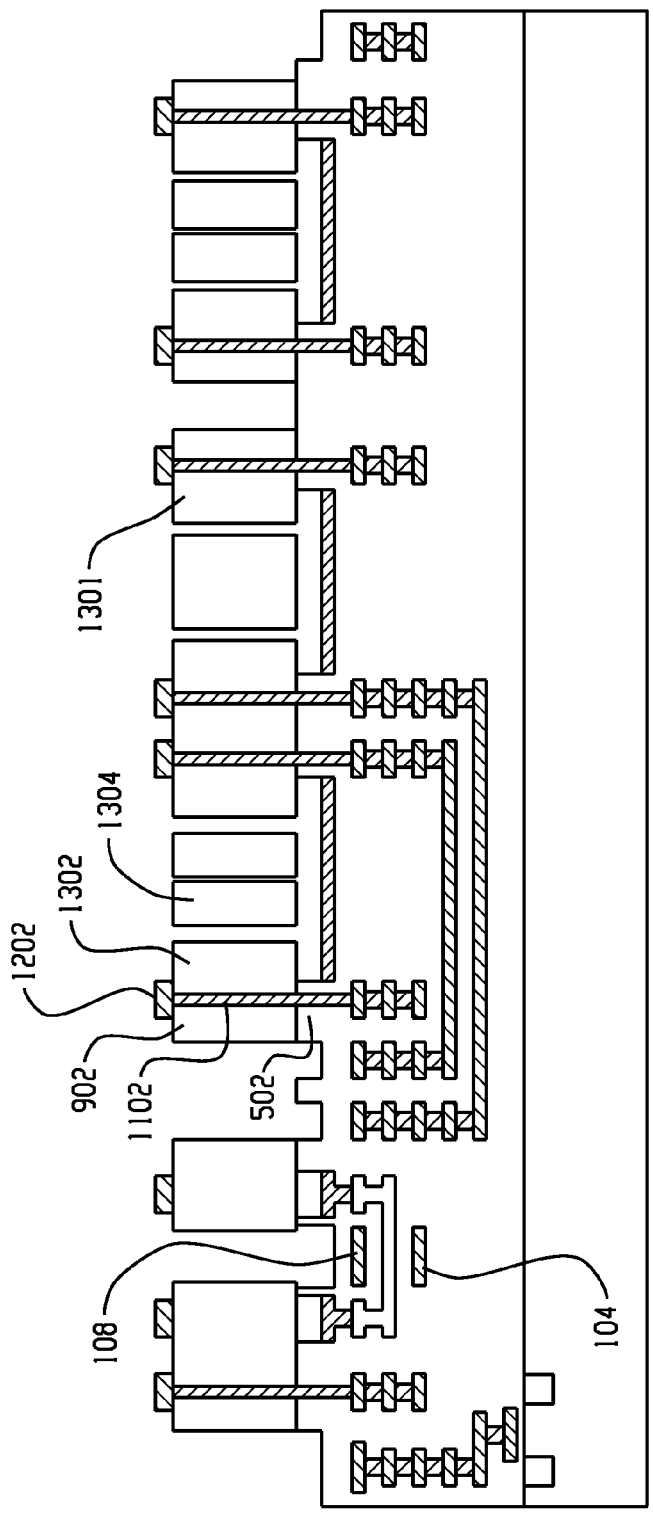
FIG. 13 is a sectional view illustrating removing of a portion of the silicon layer for forming the MEMS device according to the embodiment of the invention.

FIG. 13 is a sectional view illustrating removing of a portion of the silicon layer for forming the MEMS device according to the embodiment of the invention. As shown in FIG. 13, a mask (not shown) may be used to define etching region for silicon structures 1301 and the membrane type sensor and electrical connection. Then, a portion of the silicon layer 902 may be removed by, for example, a dry etching process. Therefore, the silicon layer 902 over the second portion of the substrate may be patterned to form the silicon structures 1301 of the bulk silicon sensor. Furthermore, the vias 1102 may be provided to extend from the bonding pads 1202 through the silicon layer 902 and the oxide layer 502 to electrically connect the electrodes of the membrane type sensor and the electrodes of the bulk silicon sensor with the bonding pads 1102. In the exemplary embodiment, the electrodes of the membrane type may be coupled to conductive base 104 and to reference element 108 and the electrodes of the bulk silicon sensor may be a portion 1302, 1304 of the silicon structure 1301.

Figure 14:
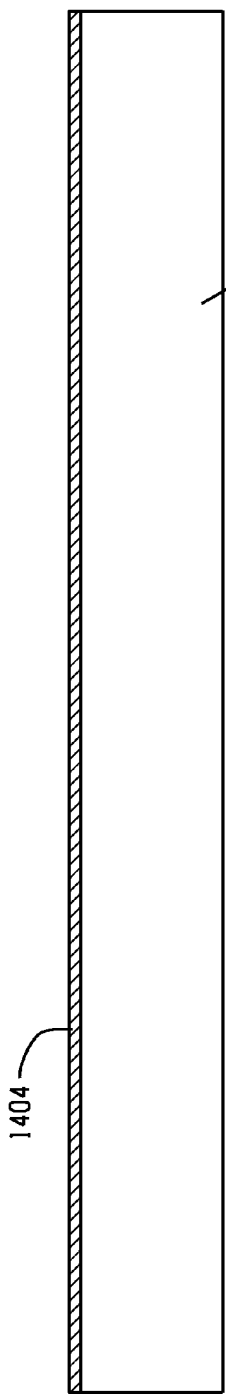
FIG. 14 is a sectional view illustrating providing of a germanium layer over a capping silicon layer for forming the MEMS device according to the embodiment of the invention.

FIG. 14 is a sectional view illustrating providing of a germanium layer over a capping silicon layer for forming the MEMS device according to the embodiment of the invention. As shown in FIG. 14, a capping silicon layer 1402 may be provided. A germanium layer 1404 may be provided over the capping silicon layer 1402. The germanium layer 1404 may have a thickness of about 3000 Å to 8000 Å.

Figure 15:
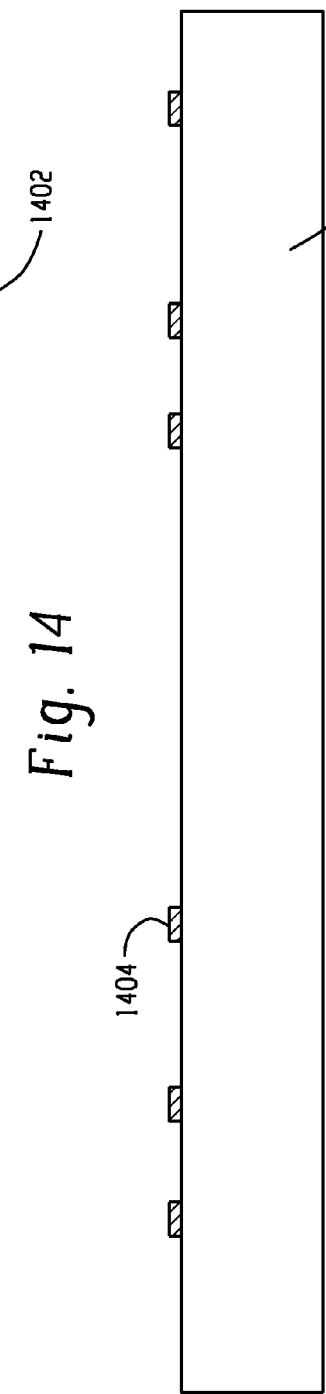
FIG. 15 is a sectional view illustrating removing of a portion of the germanium layer for forming the MEMS device according to the embodiment of the invention.

FIG. 15 is a sectional view illustrating removing of a portion of the germanium layer for forming the MEMS device according to the embodiment of the invention. As shown in FIG. 15, a mask (not shown) may be used to define an etching region for the germanium layer 1404. Then, a portion of the germanium layer 1404 may be removed by, for example, a dry etching process.

Figure 16:
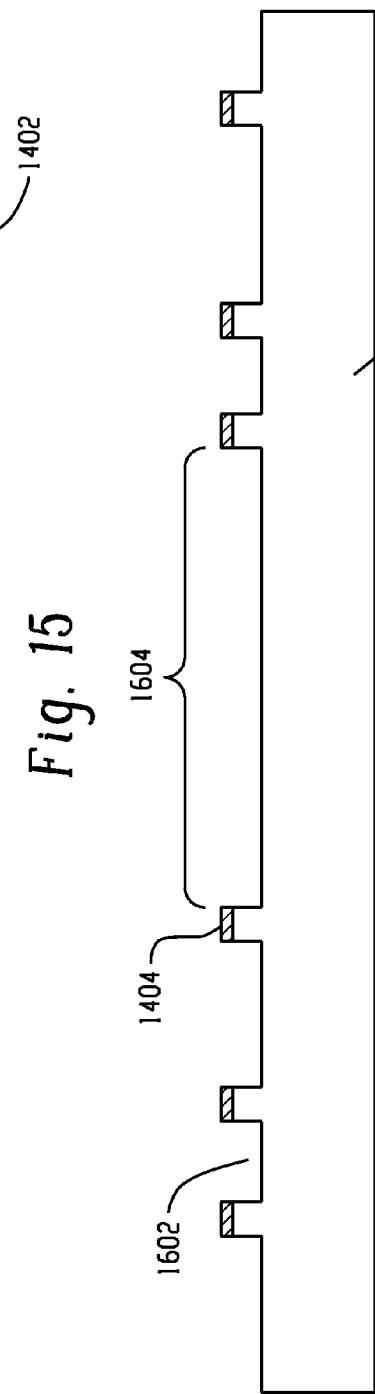
FIG. 16 is a sectional view illustrating removing of a portion of the capping silicon layer for forming the MEMS device according to the embodiment of the invention.

FIG. 16 is a sectional view illustrating removing of a portion of the capping silicon layer for forming the MEMS device according to the embodiment of the invention. As shown in FIG. 16, a mask (not shown) may be used to define an etching region for the capping silicon layer 1402. Then, a portion of the capping silicon layer 1402 may be removed for about 3 µm to 10 µm by, for example, a dry etching process to define a second cavity 1602 of the membrane type sensor and a second cavity 1604 of the bulk silicon sensor.

Figure 17:
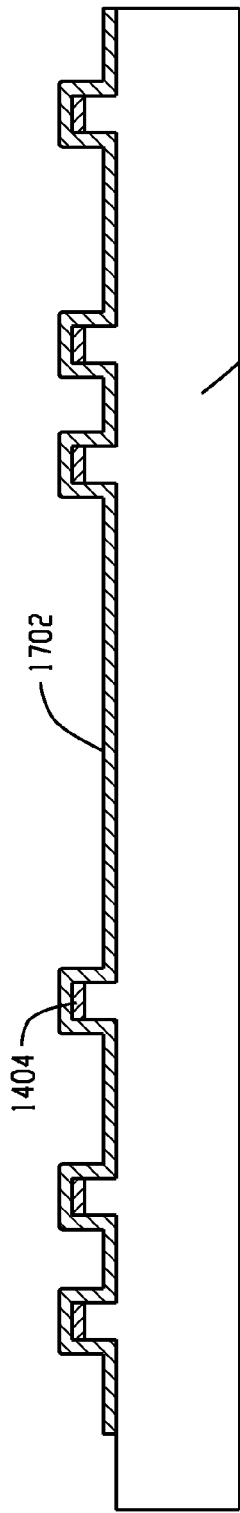
FIG. 17 is a sectional view illustrating providing of a capping oxide layer for forming the MEMS device according to the embodiment of the invention.

FIG. 17 is a sectional view illustrating providing of a capping oxide layer for forming the MEMS device according to the embodiment of the invention. As shown in FIG. 17, a capping oxide layer 1702 may be formed for about 10000 Å to 20000 Å by oxide deposition as a hard mask for deep trench and in preparation of opening the membrane type sensor.

Figure 18:
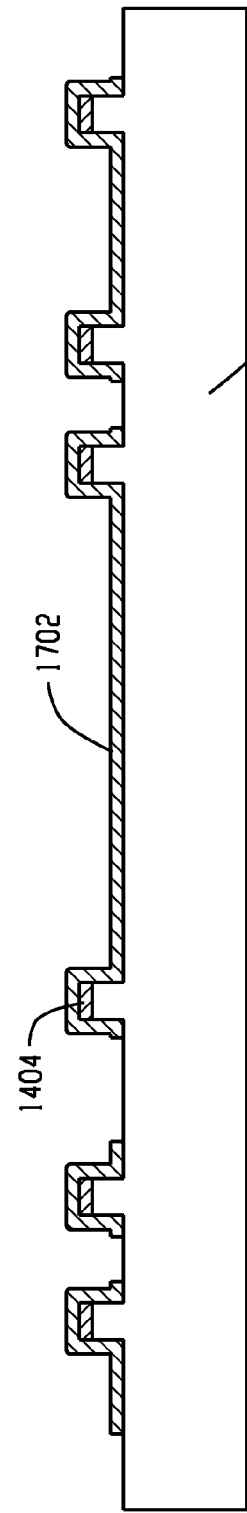
FIG. 18 is a sectional view illustrating opening of a portion of the capping oxide layer for forming the MEMS device according to the embodiment of the invention.

FIG. 18 is a sectional view illustrating opening of a portion of the capping oxide layer for forming the MEMS device according to the embodiment of the invention. As shown in FIG. 18, a mask (not shown) may be used to define an etching region for opening a portion of the capping oxide layer 1702. Then, a portion of the capping oxide layer 1702 may be removed for about 10000 Å to 20000 Å by, for example, a dry etching process.

Figure 19:
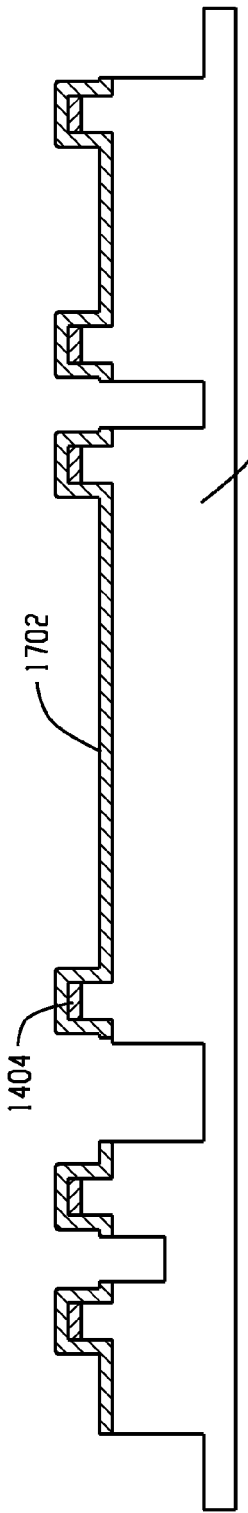
FIG. 19 is a sectional view illustrating removing of a portion of the capping silicon layer for forming the MEMS device according to the embodiment of the invention.

FIG. 19 is a sectional view illustrating removing of a portion of the capping silicon layer for forming the MEMS device according to the embodiment of the invention. As shown in FIG. 19, a mask (not shown) may be used to define etching region for the deep silicon etching windows. Then, a portion of the capping silicon layer 1402 may be removed for about 100 µm to 140 µm by, for example, a dry etching process.

FIG. 20 is a sectional view illustrating removing of a portion of the capping silicon layer for forming the MEMS device according to the embodiment of the invention. As shown in FIG. 20, the capping oxide layer 1702 may be used as a hard mask. Then, a portion of the capping silicon layer 1402 may be removed for about 30 µm to 60 µm by, for example, a dry etching process.

FIG. 21 is a sectional view illustrating removing of a portion of the capping oxide layer for forming the MEMS device according to the embodiment of the invention. As shown in FIG. 21, the capping oxide layer 1702 may be removed for about 10000 Å to 20000 Å by, for example, a wet etching process. A capping structure 2102 may be provided.

Figure 22:
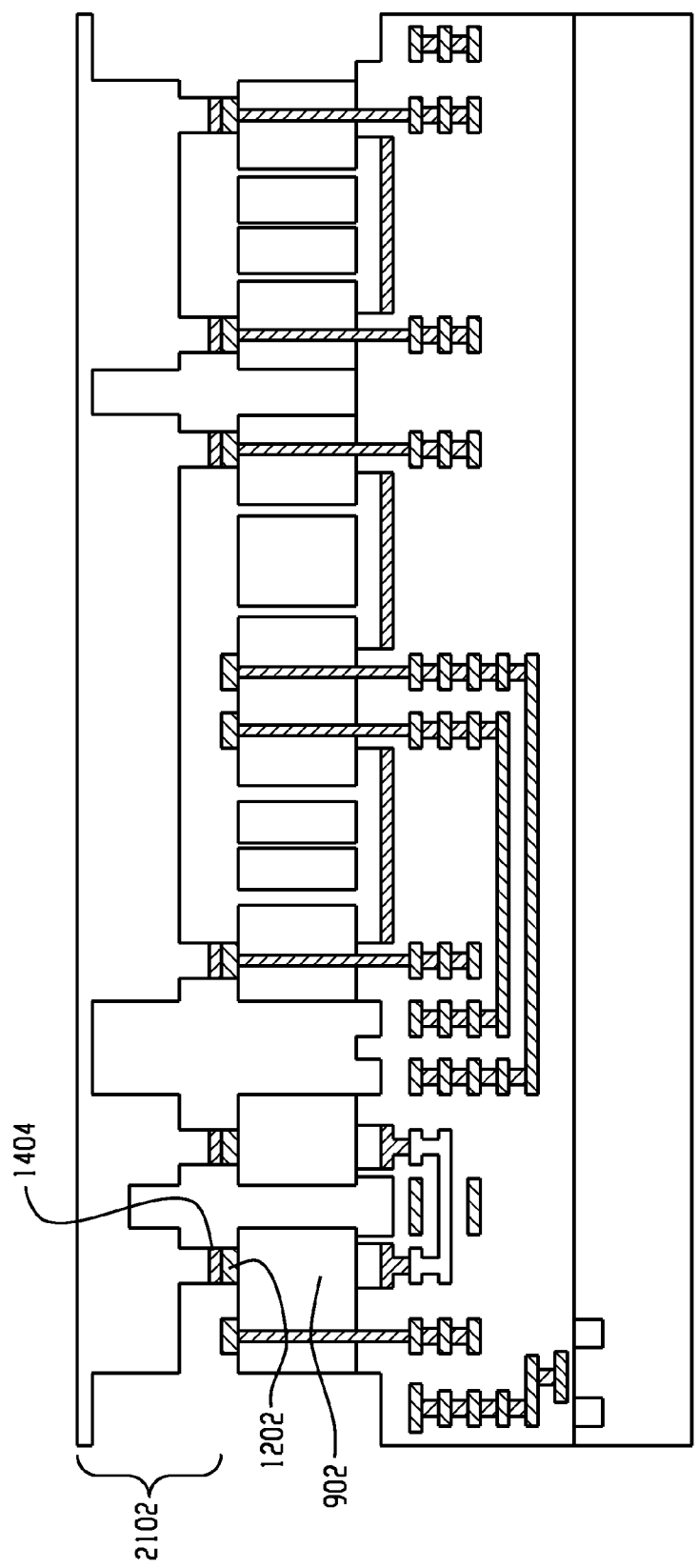
FIG. 22 is a sectional view illustrating bonding of the germanium layer to the bonding pads for forming the MEMS device according to the embodiment of the invention.

FIG. 22 is a sectional view illustrating bonding of the germanium layer to the bonding pads for forming the MEMS device according to the embodiment of the invention. As shown in FIG. 22, the capping structure 2102 may be bonded to the silicon layer 902 by Eutectic bonding. To be more specific, the germanium layer 1404 of the capping structure 2102 may be bonded to the bonding pads 1202 over the silicon layer 902. In the exemplary embodiment, the bonding pads 1202 may be formed of aluminum-copper and Al/Cu/Ge Eutectic bonding may be performed.

Figure 23:
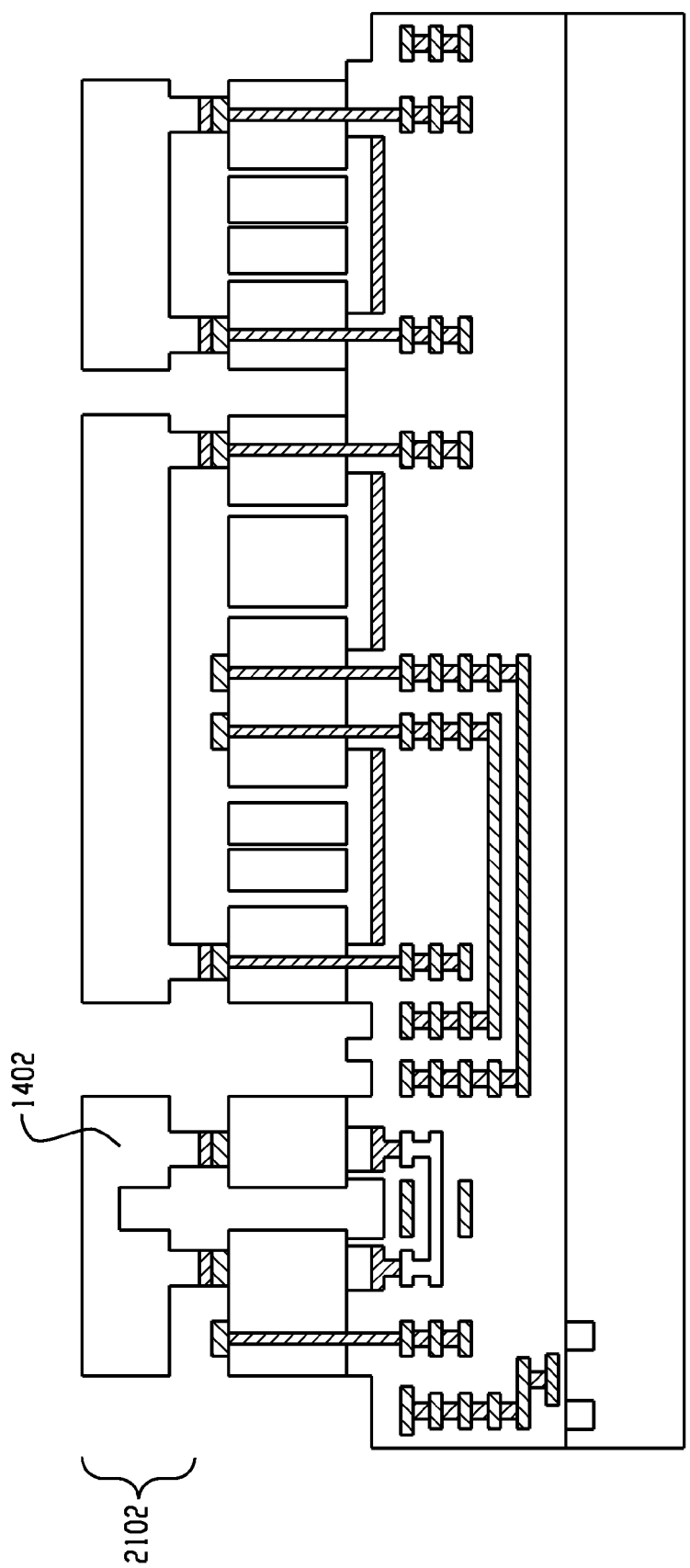
FIG. 23 is a sectional view illustrating performing a grind-to-open process on the capping silicon layer for forming the MEMS device according to the embodiment of the invention.

FIG. 23 is a sectional view illustrating performing a grind-to-open process on the capping silicon layer for forming the MEMS device according to the embodiment of the invention. As shown in FIG. 23, a grind-to-open (GTO) process may be performed on the capping silicon layer 1402 of the capping structure 2102 to make the membrane type sensor and the bulk silicon sensor apart.

Figure 24:
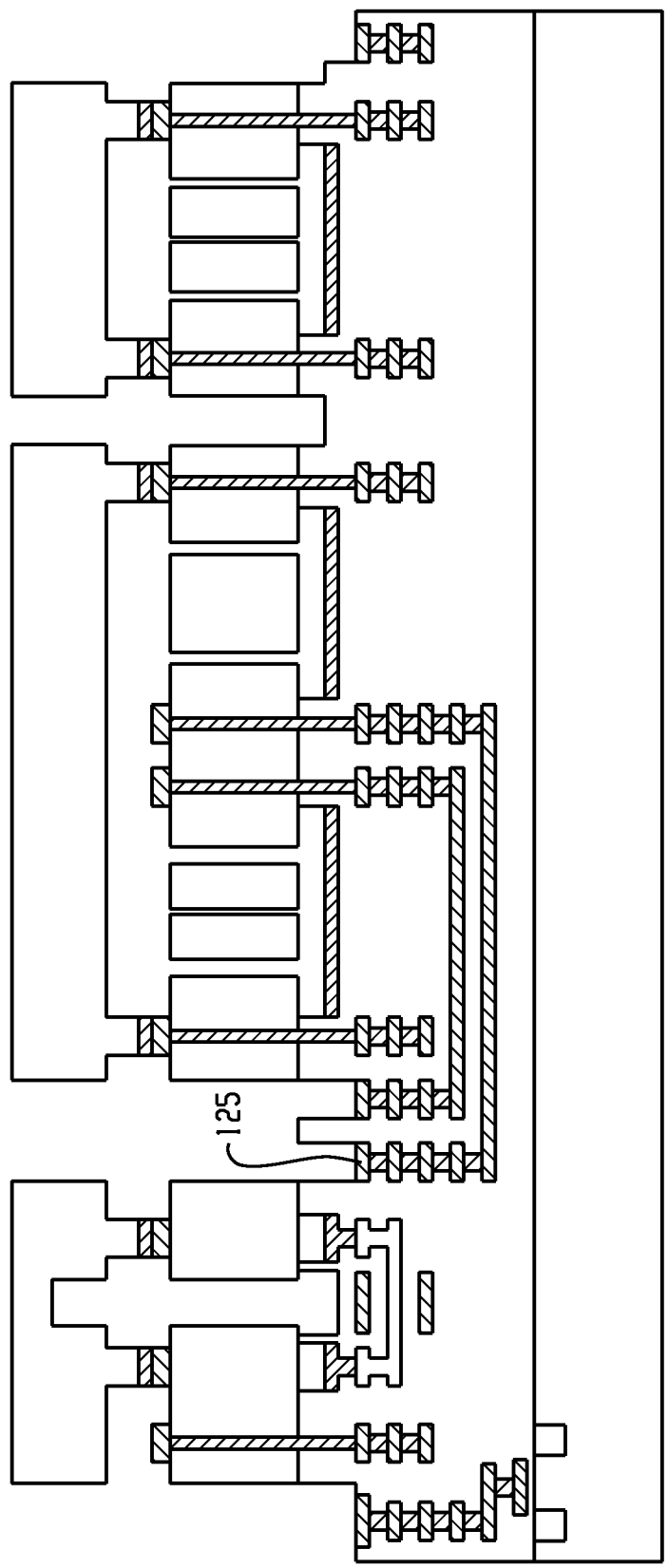
FIG. 24 is a sectional view illustrating removing of a portion of the dielectric layer for forming the MEMS device according to the embodiment of the invention.

FIG. 24 is a sectional view illustrating removing of a portion of the dielectric layer for forming the MEMS device according to the embodiment of the invention. As shown in FIG. 24, the dielectric layer over the portion of metal layer 125 may be removed by wafer-level etching back process so that the portion of metal layer 125 may be exposed for electrical connection.

Figure 25:
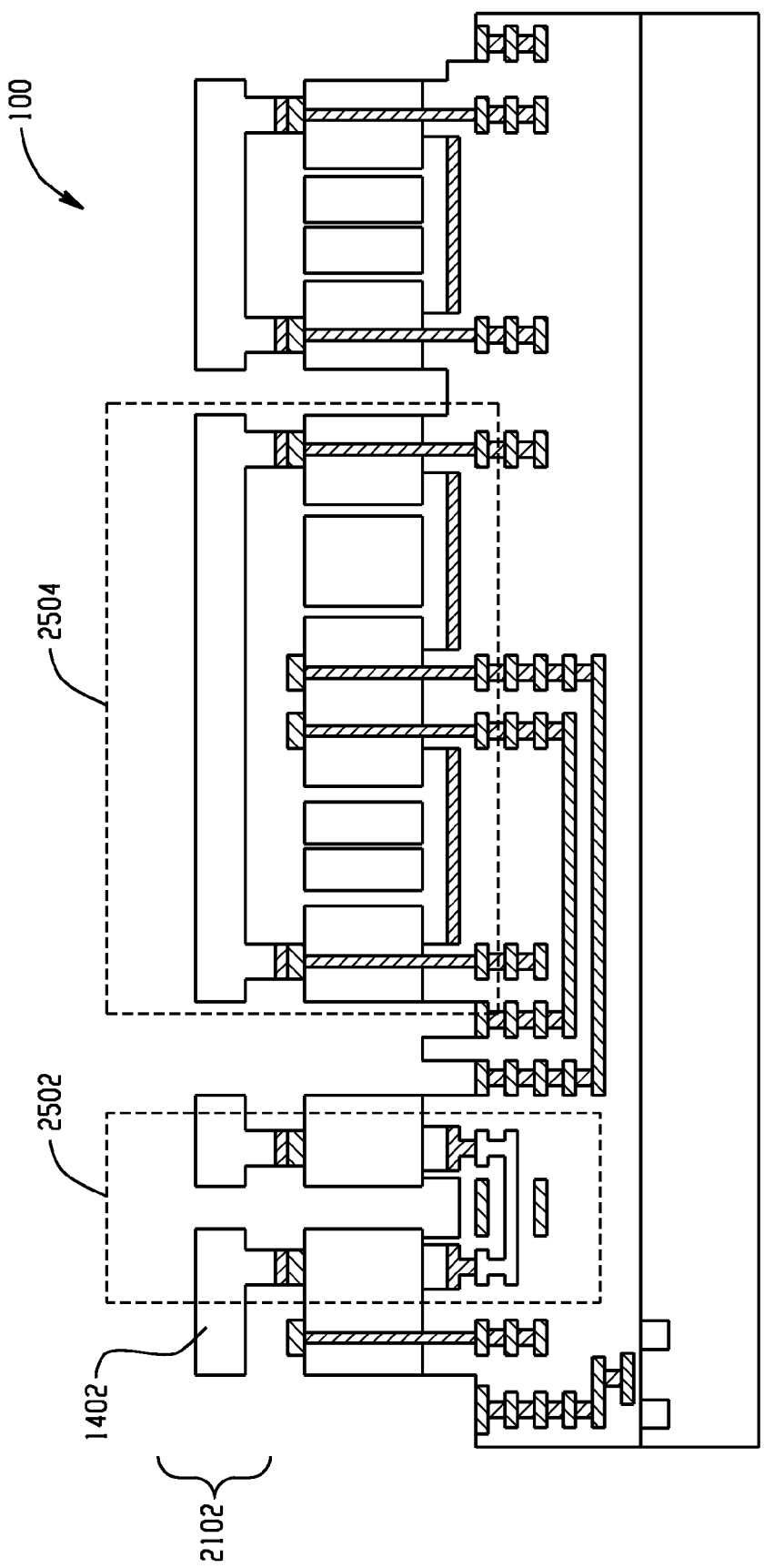
FIG. 25 is a sectional view illustrating opening of a portion of the capping silicon layer for forming the MEMS device according to the embodiment of the invention.

FIG. 25 is a sectional view illustrating opening of a portion of the capping silicon layer for forming the MEMS device according to the embodiment of the invention. As shown in FIG. 25, in the exemplary embodiment, a membrane type sensor 2502 and a bulk silicon sensor 2504 are formed in the MEMS device 100. A portion of the capping silicon layer 1402 of the capping structure 2102 may be opened by wafer-level etching back process so as to expose the membrane type sensor 2502.

Figure 26:
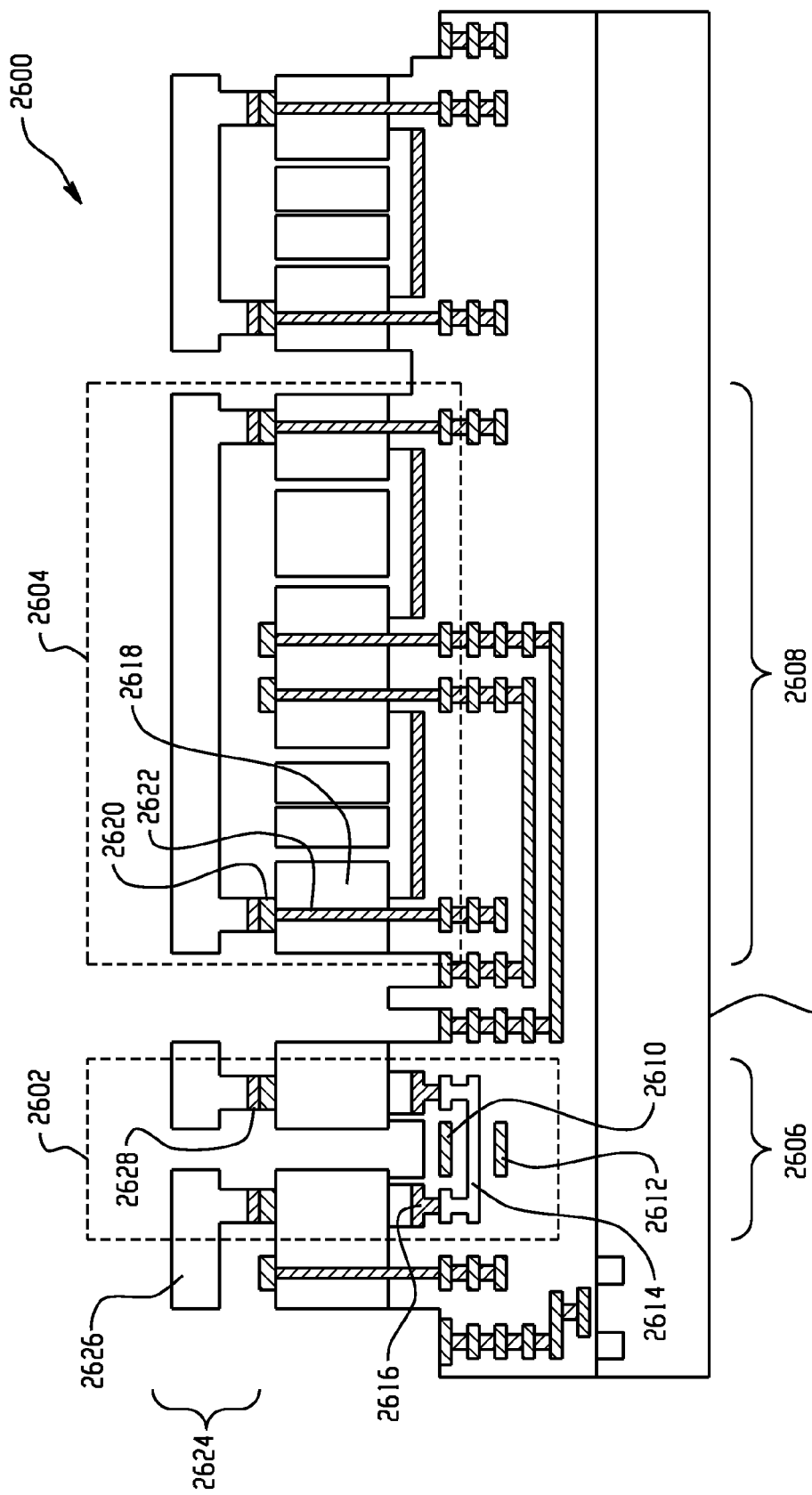
FIG. 26 is a sectional view illustrating a MEMS device according to an embodiment of the invention.

FIG. 26 is a sectional view illustrating a MEMS device according to an embodiment of the invention. As shown in FIG. 26, a MEMS device 2600 may be provided in the exemplary embodiment of the invention. A substrate 2601 may have a first portion 2606 and a second portion 2608. A membrane type sensor 2602 may be disposed on the first portion 2606 of the substrate 2601. A bulk silicon sensor 2604 may be disposed on the second portion 2608 of the substrate 2601. The membrane type sensor 2602 may include an upper metal layer 2610, a lower metal layer 2612, a sealed cavity 2614 and a sealing layer 2616. The upper metal layer 2610 and the lower metal layer 2612 may serve as electrodes of the membrane type sensor 2602. The sealed cavity 2614 may be disposed between the upper metal layer 2610 and the lower metal layer 2612. The sealing layer 2616 may substantially seal the sealed cavity 2614. In the exemplary embodiment, the sealing layer 2616 may be, for example, Titanium.

In the exemplary embodiment, the bulk silicon sensor 2604 may include silicon structures 2618 configured as electrodes disposed above the sealing layer 2616 at the second portion 2608 of the substrate 2601.

In the exemplary embodiment, the MEMS device 2600 may further include bonding pads 2620 and vias 2622. The bonding pads 2620 may be disposed above the silicon structures 2618. The vias 2622 may extend from the bonding pads 2620 and through the silicon structures 2618 to electrically connect electrodes of the membrane type sensor 2602 and the bulk silicon sensor 2604 to the bonding pads 2620.

In the exemplary embodiment, the MEMS device 2600 may further include a capping structure 2624. The capping structure 2624 may be disposed above the bonding pads 2620.

In the exemplary embodiment, the capping structure 2624 may include a capping silicon layer 2626 and a germanium layer 2628. The germanium layer 2628 may be disposed between the capping silicon layer 2626 and the bonding pads 2620.

Figure 27:
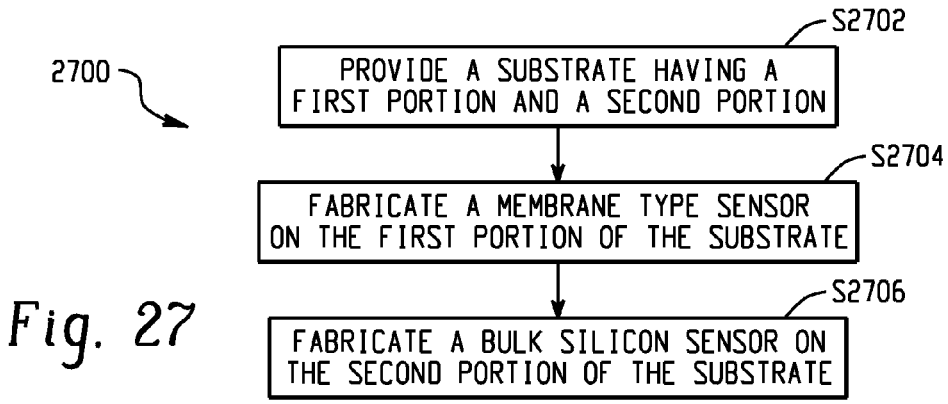
FIG. 27 is a flow chart for forming a MEMS device according to an embodiment of the invention.

FIG. 27 is a flow chart for forming a MEMS device according to an exemplary embodiment of the invention. As shown in FIG. 27, the method 2700 for forming a MEMS device is provided. The method 2700 may include the following procedures: providing a substrate having a first portion and a second portion (S2702); fabricating a membrane type sensor on the first portion of the substrate (S2704); and fabricating a bulk silicon sensor on the second portion of the substrate (S2706).

Figure 28:
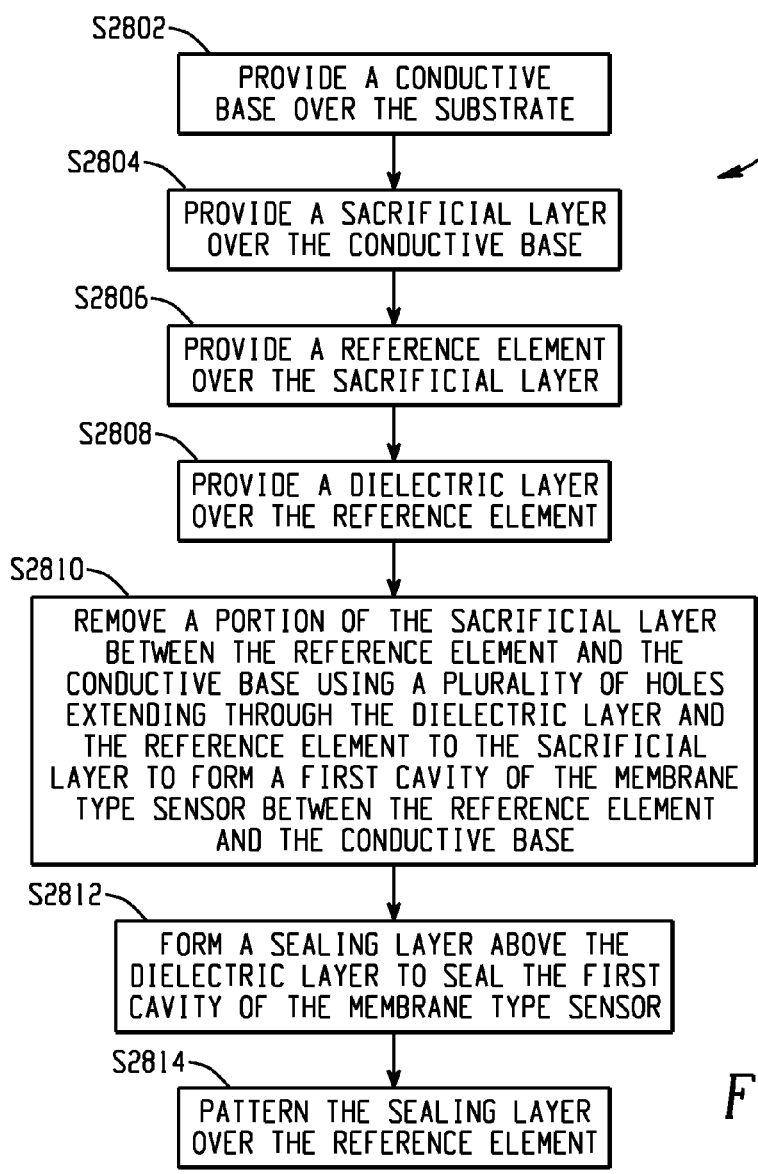
FIG. 28 is a flow chart for the operation of fabricating the membrane type sensor according to an exemplary embodiment of the invention.

FIG. 28 is a flow chart for the operation of fabricating the membrane type sensor according to an exemplary embodiment of the invention. As shown in FIG. 28, the operation S2704 for fabricating the membrane type sensor is provided. The operation S2704 may include the following procedures: providing a conductive base over the substrate (S2802); providing a sacrificial layer over the conductive base (S2804); providing a reference element over the sacrificial layer (S2806); providing a dielectric layer over the reference element (S2808); removing a portion of the sacrificial layer between the reference element and the conductive base using a plurality of holes extending through the dielectric layer and the reference element to the sacrificial layer to form a first cavity of the membrane type sensor between the reference element and the conductive base (S2810); forming a sealing layer above the dielectric layer to seal the first cavity of the membrane type sensor (S2812); and patterning the sealing layer over the reference element (S2814).

In the exemplary embodiment, the operation of removing a portion of the sacrificial layer between the reference element and the conductive base using the holes may include isotropic etching. In the exemplary embodiment, the step of patterning the sealing layer comprises performing, for example, a dry etching process on the sealing layer.

Figure 29:
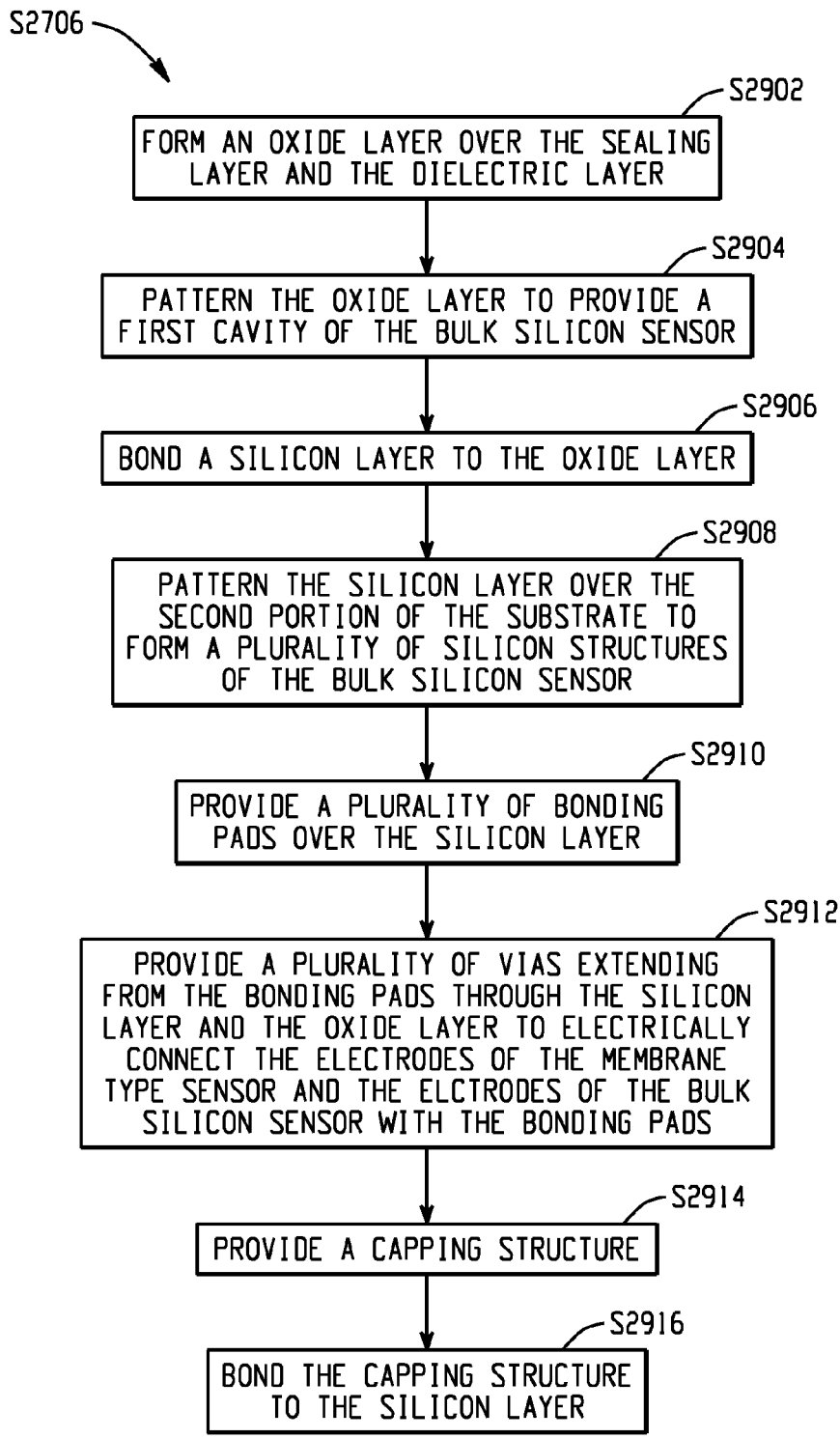
FIG. 29 is a flow chart for the operation of fabricating the bulk silicon sensor according to an exemplary embodiment of the invention.

FIG. 29 is a flow chart for the operation of fabricating the bulk silicon sensor according to an exemplary embodiment of the invention. As shown in FIG. 29, the operation S2706 for fabricating the bulk silicon sensor is provided. The operation S2706 may include the following procedures: forming an oxide layer over the sealing layer and the dielectric layer (S2902); patterning the oxide layer to provide a first cavity of the bulk silicon sensor (S2904); bonding a silicon layer to the oxide layer (S2906); patterning the silicon layer over the second portion of the substrate to form a plurality of silicon structures of the bulk silicon sensor (S2908); providing a plurality of bonding pads over the silicon layer (S2910); providing a plurality of vias extending from the bonding pads through the silicon layer and the oxide layer to electrically connect the electrodes of the membrane type sensor and the electrodes of the bulk silicon sensor with the bonding pads (S2912); providing a capping structure (S2914); and bonding the capping structure to the silicon layer (S2916).

In the exemplary embodiment, the operation of patterning the sealing layer further includes patterning the sealing layer as a getter for the membrane type sensor and the bulk silicon sensor. In the exemplary embodiment, the step of forming the sealing layer further includes using Titanium as the sealing layer. In the exemplary embodiment, the step of patterning the oxide layer further comprises performing chemical mechanical polishing on the oxide layer.

Figure 30:
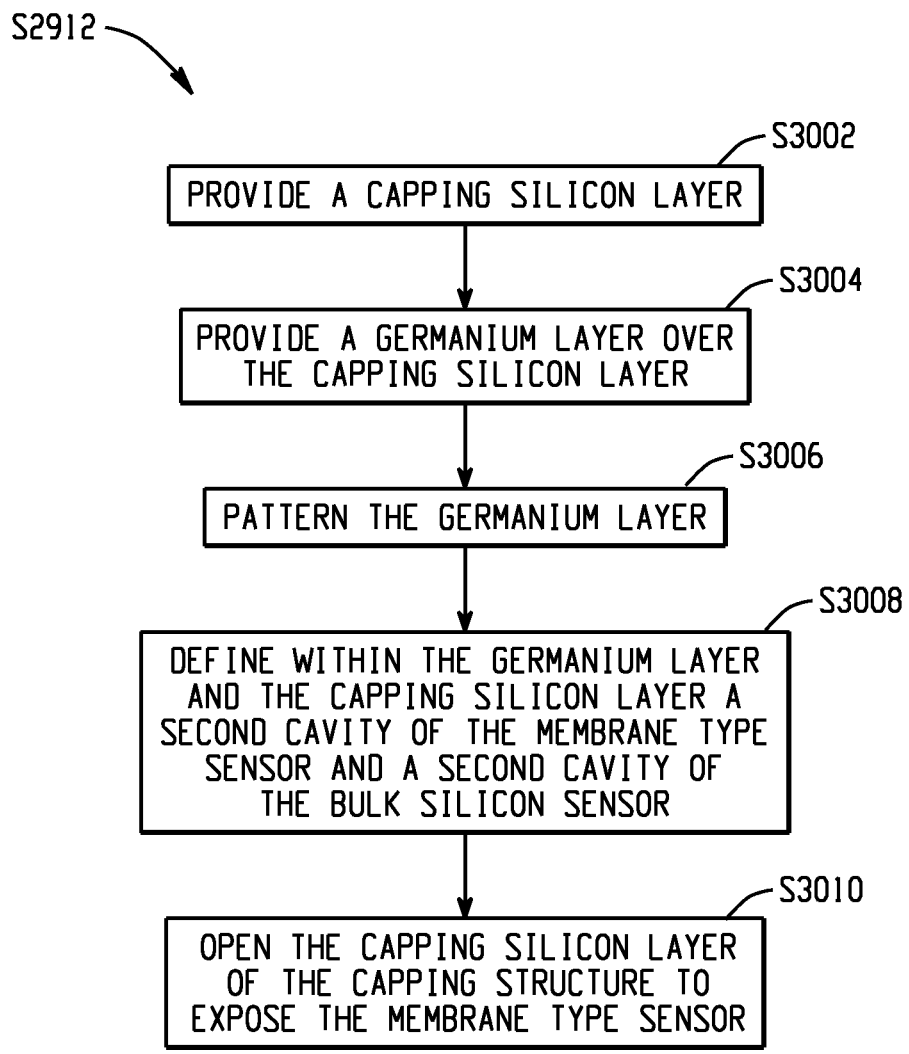
FIG. 30 is a flow chart for the operation of providing the capping structure according to an exemplary embodiment of the invention.

FIG. 30 is a flow chart for the operation of providing the capping structure according to an exemplary embodiment of the invention. As shown in FIG. 30, the operation S2912 for fabricating the bulk silicon sensor is provided. The operation S2912 may include the following procedures: providing a capping silicon layer (S3002); providing a germanium layer over the capping silicon layer (S3004); patterning the germanium layer (S3006); defining within the germanium layer and the capping silicon layer a second cavity of the membrane type sensor and a second cavity of the bulk silicon sensor (S3008); and opening the capping silicon layer of the capping structure to expose the membrane type sensor (S3010).

In the exemplary embodiment, the operation of bonding the capping structure to the silicon layer further includes: bonding the germanium layer of the capping structure to the silicon layer using the bonding pads.

This written description uses examples to disclose the disclosure, include the best mode, and also to enable a person skilled in the art to make and use the disclosure. The patentable scope of the disclosure may include other examples that occur to those skilled in the art.

One skilled in the relevant art will recognize that the various embodiments may be practiced without one or more of the specific details, or with other replacement and/or additional methods, materials, or components. Well-known structures, materials, or operations may not be shown or described in detail to avoid obscuring aspects of various embodiments of the disclosure. Various embodiments shown in the figures are illustrative example representations and are not necessarily drawn to scale. Particular features, structures, materials, or characteristics may be combined in any suitable manner in one or more embodiments. Various additional layers and/or structures may be included and/or described features may be omitted in other embodiments. Various operations may be described as multiple discrete operations in turn, in a manner that is most helpful in understanding the disclosure. However, the order of description should not be construed as to imply that these operations are necessarily order dependent. In particular, these operations need not be performed in the order of presentation. Operations described herein may be performed in a different order, in series or in parallel, than the described embodiment. Various additional operations may be performed and/or described. Operations may be omitted in additional embodiments.

This written description and the following claims may include terms, such as left, right, top, bottom, over, under, upper, lower, first, second, etc. that are used for descriptive purposes only and are not to be construed as limiting. For example, terms designating relative vertical position may refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and may still fall within the meaning of the term "top." The term "on" as used herein (including in the claims) may not indicate that a first layer "on" a second layer is directly on and in immediate contact with the second layer unless such is specifically stated; there may be a third layer or other structure between the first layer and the second layer on the first layer. The embodiments of a device or article described herein may be manufactured, used, or shipped in a number of positions and orientations. Persons skilled in the art will recognize various equivalent combinations and substitutions for various components shown in the figures.

What is claimed is:

1. A method for forming a microelectromechanical systems (MEMS) device, comprising:
   providing a substrate having a first portion and a second portion;
   fabricating a membrane type sensor on the first portion of the substrate; and
   fabricating a bulk silicon sensor on the second portion of the substrate,
   wherein fabricating the membrane type sensor further comprises:
   providing a conductive base over the substrate;
   providing a sacrificial layer over the conductive base;
   providing a reference element over the sacrificial layer;
   providing a dielectric layer over the reference element;
   removing a portion of the sacrificial layer between the reference element and the conductive base using a plurality of holes extending through the dielectric layer and the reference element to the sacrificial layer to form a first cavity of the membrane type sensor between the reference element and the conductive base;
   forming a sealing layer above the dielectric layer to seal the first cavity of the membrane type sensor by using Titanium as the sealing layer; and
   patterning the sealing layer over the reference element.

2. The method of claim 1, wherein fabricating the bulk silicon sensor further comprises:
   forming an oxide layer over the sealing layer and the dielectric layer;
   patterning the oxide layer to provide a first cavity of the bulk silicon sensor;
   bonding a silicon layer to the oxide layer; and
   patterning the silicon layer over the second portion of the substrate to form a plurality of silicon structures of the bulk silicon sensor.

3. The method of claim 1, wherein fabricating the membrane type sensor on the first portion of the substrate comprises fabricating a device selected from the group consisting of a pressure sensor, an acoustic sensor, a radio-frequency resonator, and a radio-frequency oscillator.

4. The method of claim 1, wherein fabricating the bulk silicon sensor on the second portion of the substrate comprises fabricating a second device selected from the group consisting of an accelerometer, an gyroscope, a magnetic sensor, a radio-frequency resonator, and a radio-frequency oscillator.

5. The method of claim 2, wherein patterning the sealing layer further comprises patterning the sealing layer as a getter for the membrane type sensor and the bulk silicon sensor.

6. The method of claim 1, wherein removing a portion of the sacrificial layer between the reference element and the conductive base using the holes comprises isotropic etching.

7. The method of claim 1, wherein patterning the sealing layer comprises performing dry etching process on the sealing layer.

8. The method of claim 1, wherein patterning the oxide layer further comprises performing chemical mechanical polishing on the oxide layer.

9. The method of claim 2, further comprising:
   providing a plurality of bonding pads over the silicon layer;
   providing a plurality of vias extending from the bonding pads through the silicon layer and the oxide layer to electrically connect the electrodes of the membrane type sensor and the electrodes of the bulk silicon sensor with the bonding pads;
   providing a capping structure; and
   bonding the capping structure to the silicon layer.

10. The method of claim 9, wherein providing the capping structure further comprises:
providing a capping silicon layer;
providing a germanium layer over the capping silicon layer;
patterning the germanium layer; and
defining within the germanium layer and the capping silicon layer a second cavity of the membrane type sensor and a second cavity of the bulk silicon sensor.

11. The method of claim 9, wherein bonding the capping structure to the silicon layer further comprises: bonding the germanium layer of the capping structure to the silicon layer using the bonding pads.

12. The method of claim 10 further comprising: opening the capping silicon layer of the capping structure to expose the membrane type sensor.

13. A method for forming a microelectromechanical systems (MEMS) device, comprising:
providing a substrate having a first portion and a second portion;
fabricating a membrane type sensor on the first portion of the substrate; and
fabricating a bulk silicon sensor on the second portion of the substrate, wherein fabricating the membrane type sensor further comprises:
providing a conductive base over the substrate;
providing a sacrificial layer over the conductive base;
providing a reference element over the sacrificial layer;
providing a dielectric layer over the reference element;
removing a portion of the sacrificial layer between the reference element and the conductive base using a plurality of holes extending through the dielectric layer and the reference element to the sacrificial layer to form a first cavity of the membrane type sensor between the reference element and the conductive base;
forming a sealing layer above the dielectric layer to seal the first cavity of the membrane type sensor; and
patterning the sealing layer over the reference element.

14. The method of claim 13, wherein forming the sealing layer above the dielectric layer further comprises forming the sealing layer by using Titanium as a getter to absorb hydrogen gas that outgases from the dielectric layer.

15. The method of claim 13, wherein fabricating the bulk silicon sensor further comprises:
forming an oxide layer over the sealing layer and the dielectric layer;
patterning the oxide layer to provide a first cavity of the bulk silicon sensor;
bonding a silicon layer to the oxide layer; and
patterning the silicon layer over the second portion of the substrate to form a plurality of silicon structures of the bulk silicon sensor.

16. A method for forming a microelectromechanical systems (MEMS) device, comprising:
providing a substrate having a first portion and a second portion;
fabricating a membrane type sensor on the first portion of the substrate;
fabricating a bulk silicon sensor on the second portion of the substrate; and
forming a getter by using Titanium in the membrane type sensor and the bulk silicon sensor,
wherein fabricating the membrane type sensor on the first portion of the substrate further comprises: forming a first cavity in the membrane type sensor; and forming a sealing layer by using Titanium to seal the first cavity of the membrane type sensor.

17. A method for forming a microelectromechanical systems (MEMS) device, comprising:
providing a substrate having a first portion and a second portion;
fabricating a membrane type sensor on the first portion of the substrate;
fabricating a bulk silicon sensor on the second portion of the substrate; and
forming a getter by using Titanium in the membrane type sensor and the bulk silicon sensor, wherein fabricating the bulk silicon sensor further comprises:
forming an oxide layer over a sealing layer and a dielectric layer;
patterning the oxide layer to provide a first cavity of the bulk silicon sensor;
bonding a silicon layer to the oxide layer; and
patterning the silicon layer over the second portion of the substrate to form a plurality of silicon structures of the bulk silicon sensor.

* * * * *